(12) United States Patent
Choi

(10) Patent No.: US 10,108,504 B2
(45) Date of Patent: Oct. 23, 2018

(54) SEMICONDUCTOR DATA MULTIPLEXER CIRCUIT

(71) Applicant: SK hynix Inc., Icheon-si, Gyeonggi-do (KR)

(72) Inventor: Wonseok Choi, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/654,901

(22) Filed: Jul. 20, 2017

(65) Prior Publication Data

US 2018/0268879 A1 Sep. 20, 2018

(30) Foreign Application Priority Data

Mar. 20, 2017 (KR) .................. 10-2017-0034871

(51) Int. Cl.
*G06F 11/20* (2006.01)
*G11C 7/10* (2006.01)
*G11C 7/06* (2006.01)

(52) U.S. Cl.
CPC .............. *G06F 11/20* (2013.01); *G11C 7/065* (2013.01); *G11C 7/106* (2013.01); *G11C 7/1039* (2013.01); *G11C 7/1051* (2013.01); *G11C 7/1066* (2013.01); *G11C 7/1069* (2013.01)

(58) Field of Classification Search
CPC ....... G11C 7/106; G11C 7/065; G11C 7/1069; G11C 7/1051; G11C 7/1039; G11C 7/1066
See application file for complete search history.

(56) References Cited

U.S. PATENT DOCUMENTS

| 2011/0249522 | A1 | 10/2011 | Welker et al. | |
|---|---|---|---|---|
| 2012/0151247 | A1* | 6/2012 | Ferraiolo | H04L 1/22 714/4.5 |
| 2013/0279269 | A1* | 10/2013 | Jeon | G11C 8/12 365/189.02 |
| 2015/0127870 | A1* | 5/2015 | Song | G11C 7/1003 710/308 |

FOREIGN PATENT DOCUMENTS

KR 100919815 B1 10/2009

* cited by examiner

*Primary Examiner* — Ajay Ojha
(74) *Attorney, Agent, or Firm* — William park & Associates Ltd.

(57) ABSTRACT

A semiconductor device includes a data output selection circuit suitable for outputting first pattern data as selection data in the case where a training operation is performed, outputting information data as the selection data in the case where a mode register read operation is performed, and outputting second pattern data in the case where the training operation is performed; and a data pad circuit including a first data pad and a second data pad, wherein the first data pad outputs the selection data and the second data pad outputs the second pattern data.

18 Claims, 6 Drawing Sheets

FIG.5

| | Invert? | 16 | 15 | 14 | 13 | 12 | 11 | 10 | 9 | 8 | 7 | 6 | 5 | 4 | 3 | 2 | 1 |
|---|---|---|---|---|---|---|---|---|---|---|---|---|---|---|---|---|---|
| | | | | | | | | | | Bit sequence | | | | | | | |
| SD<1> | Yes | 1 | 0 | 1 | 0 | 0 | 1 | 1 | 0 | 1 | 1 | 1 | 0 | 0 | 0 | 1 | 1 |
| SD<2> | No  | 0 | 1 | 0 | 1 | 1 | 0 | 0 | 1 | 0 | 0 | 0 | 1 | 1 | 1 | 0 | 1 |
| SD<3> | Yes | 1 | 0 | 1 | 0 | 0 | 1 | 1 | 0 | 1 | 1 | 1 | 0 | 0 | 0 | 1 | 0 |
| SD<4> | No  | 0 | 1 | 0 | 1 | 1 | 0 | 0 | 1 | 0 | 0 | 0 | 1 | 1 | 1 | 0 | 1 |
| SD<5> | Yes | 1 | 0 | 1 | 0 | 0 | 1 | 1 | 0 | 1 | 1 | 1 | 0 | 0 | 0 | 1 | 0 |
| SD<6> | No  | 0 | 1 | 0 | 1 | 1 | 0 | 0 | 1 | 0 | 0 | 0 | 1 | 1 | 1 | 0 | 1 |
| SD<7> | Yes | 1 | 0 | 1 | 0 | 0 | 1 | 1 | 0 | 1 | 1 | 1 | 0 | 0 | 0 | 1 | 0 |
| SD<8> | No  | 0 | 1 | 0 | 1 | 1 | 0 | 0 | 1 | 0 | 0 | 0 | 1 | 1 | 1 | 0 | 1 |
| PTD<1> | Yes | 1 | 0 | 1 | 0 | 0 | 1 | 1 | 0 | 1 | 1 | 1 | 0 | 0 | 0 | 1 | 0 |
| PTD<2> | No  | 0 | 1 | 0 | 1 | 1 | 0 | 0 | 1 | 0 | 0 | 0 | 1 | 1 | 1 | 0 | 1 |
| PTD<3> | Yes | 1 | 0 | 1 | 0 | 0 | 1 | 1 | 0 | 1 | 1 | 1 | 0 | 0 | 0 | 1 | 0 |
| PTD<4> | No  | 0 | 1 | 0 | 1 | 1 | 0 | 0 | 1 | 0 | 0 | 0 | 1 | 1 | 1 | 0 | 1 |
| PTD<5> | Yes | 1 | 0 | 1 | 0 | 0 | 1 | 1 | 0 | 1 | 1 | 1 | 0 | 0 | 0 | 1 | 0 |
| PTD<6> | No  | 0 | 1 | 0 | 1 | 1 | 0 | 0 | 1 | 0 | 0 | 0 | 1 | 1 | 1 | 0 | 1 |
| PTD<7> | Yes | 1 | 0 | 1 | 0 | 0 | 1 | 1 | 0 | 1 | 1 | 1 | 0 | 0 | 0 | 1 | 0 |
| PTD<8> | No  | 0 | 1 | 0 | 1 | 1 | 0 | 0 | 1 | 0 | 0 | 0 | 1 | 1 | 1 | 0 | 0 |

SEMICONDUCTOR DATA MULTIPLEXER CIRCUIT

CROSS-REFERENCE TO RELATED APPLICATION

The present application claims priority under 35 U.S.C. § 119(a) to Korean Patent Application No. 10-2017-0034871 filed on Mar. 20, 2017 in the Korean Intellectual Property Office, which is incorporated herein by reference in its entirety.

BACKGROUND

1. Technical Field

Embodiments of the present disclosure relate to a semiconductor device which performs a training operation and a mode register read operation.

2. Related Art

In general, register sets (RS) are used to define operation modes of a semiconductor device. The register sets (RS) are configured by mode register sets (MRS) and extended mode register sets (EMRS). The mode register sets and the extended mode register sets set the operation modes of the semiconductor device by values applied to address pins together with a mode register set command. Information on set operation modes is retained until the set operation modes are reprogrammed or power of the semiconductor device is turned off.

Recently, a semiconductor device provides a mode register write (MRW) operation for inputting information of set modes to registers and a mode register read (MRR) operation for outputting information of the modes stored in the registers.

Meanwhile, a semiconductor device outputs data in synchronization with a data strobe signal in a read operation. As the operation speed of a semiconductor device increases, it is important to control output timing between data and a data strobe signal.

SUMMARY

Various embodiments are directed to a semiconductor device which performs a training operation and a mode register read operation.

In an embodiment, a semiconductor device may include: a data output selection circuit suitable for outputting first pattern data as selection data in the case where a training operation is performed, outputting information data as the selection data in the case where a mode register read operation is performed, and outputting second pattern data in the case where the training operation is performed; and a data pad circuit including a first data pad and a second data pad, wherein the first data pad outputs the selection data and the second data pad outputs the second pattern data.

In an embodiment, a semiconductor device may include: a data selector suitable for outputting first pattern data as selection data in the case where a training operation is performed, and outputting information data as the selection data in the case where a mode register read operation is performed; and a first data storage circuit suitable for outputting second pattern data in the case where the training operation is performed.

According to the embodiments, by sharing data pads through which data are outputted in a training operation and a mode register read operation, a layout area may be reduced when compared to the case where data are outputted through separate data pads in the training operation and the mode register read operation.

BRIEF DESCRIPTION OF THE DRAWINGS

FIG. 5 is a table illustrating a representation of an example of bit sequences of data outputted from the data output selection circuit shown in FIG. 4.

DETAILED DESCRIPTION

Hereinafter, a semiconductor device will be described below with reference to the accompanying drawings through various examples embodiments.

Figure 1:
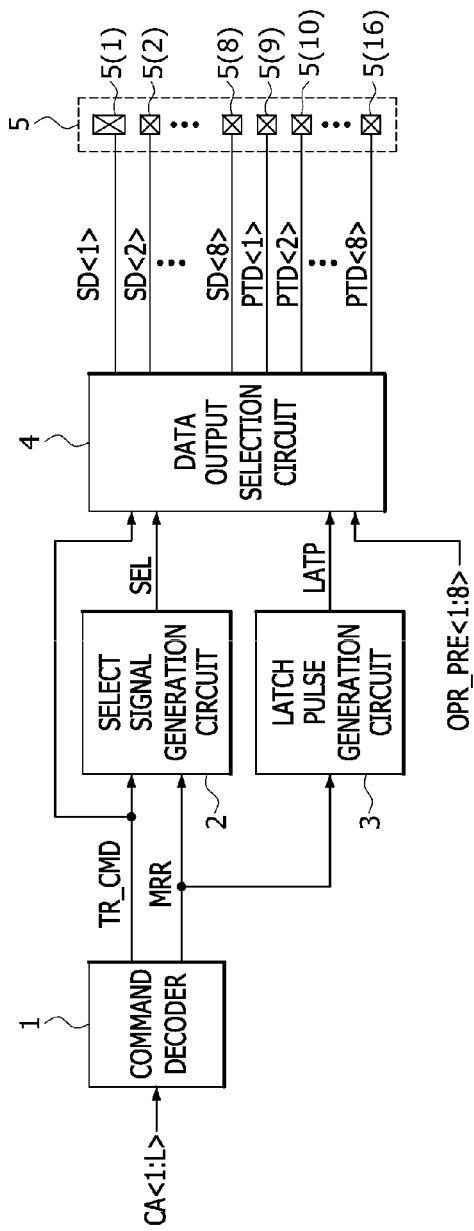
FIG. 1 is a block diagram illustrating a representation of an example of a configuration of a semiconductor device in accordance with an embodiment.

As shown in FIG. 1, a semiconductor device in accordance with an embodiment may include a command decoder 1, a select signal generation circuit 2, a latch pulse generation circuit 3, a data output selection circuit 4, and a data pad circuit 5.

The command decoder 1 may generate a training command TR_CMD and a mode register read command MRR in response to a command address CA<1:L>. The command decoder 1 may generate the training command TR_CMD and the mode register read command MRR by decoding the command address CA<1:L>. The command decoder 1 may generate the training command TR_CMD in the case where a first predetermined logic level combination of the command address CA<1:L> is inputted. The command decoder 1 may generate the mode register read command MRR in the case where a second predetermined logic level combination of the command address CA<1:L> is inputted. The training command TR_CMD may be generated for a training operation for a read data calibration operation. The training operation may be performed in such a way as to output the pattern data stored in mode registers (not shown), through data pads. The mode register read command MRR may be generated for a mode register read operation. The mode register read operation may be performed in such a way as to output the data stored in mode registers (not shown) by a mode register write operation. The command address CA<1:L> may include at least one of a command and an address. The bit number L of the command address CA<1:L> may be set variously according to embodiments.

The select signal generation circuit 2 may generate a select signal SEL in response to the training command TR_CMD and the mode register read command MRR. The select signal generation circuit 2 may generate the select signal SEL which is driven to a first logic level in the case where the training command TR_CMD is generated. The select signal generation circuit 2 may generate the select signal SEL which is driven to a second logic level in the case where the mode register read command MRR is generated. The first logic level and the second logic level may be set to a logic low level or a logic high level according to an embodiment.

The latch pulse generation circuit 3 may generate a latch pulse LATP in response to the mode register read command MRR. The latch pulse generation circuit 3 may generate the latch pulse LATP in the case where the mode register read command MRR is generated. The latch pulse generation circuit 3 may generate the latch pulse LATP in synchronization with a predetermined edge of the mode register read command MRR. For example, the latch pulse generation circuit 3 may generate the latch pulse LATP in synchronization with a time that the mode register read command MRR transitions from a logic high level to a logic low level, that is, a falling edge.

The data output selection circuit 4 may output first to eighth pattern data PTD<1:8> stored in mode registers (not shown) in response to the training command TR_CMD, the latch pulse LATP, and the select signal SEL. The data output selection circuit 4 may output ninth to sixteenth pattern data PTD<9:16> (see FIG. 4) stored in mode registers (not shown) or pre-information data OPR_PRE<1:8> as first to eighth selection data SD<1:8> in response to the training command TR_CMD, the latch pulse LATP, and the select signal SEL. In the case where the training operation is performed, the data output selection circuit 4 may output the first to eighth pattern data PTD<1:8> and the data output selection circuit 4 may output the ninth to sixteenth pattern data PTD<9:16> as the first to eighth selection data SD<1:8>. In the case where the mode register read operation is performed, the data output selection circuit 4 may output the pre-information data OPR_PRE<1:8> as the first to eighth selection data SD<1:8>. The number of bits included in pattern data and pre-information data may be set variously according to embodiments.

The data pad circuit 5 may include first to sixteenth data pads 5(1:16). The first to eighth selection data SD<1:8> may be outputted through the first to eighth data pads 5(1:8). The first to eighth pattern data PTD<1:8> may be outputted through the ninth to sixteenth data pads 5(9:16). The number of data pads may be set variously according to embodiments.

Figure 2:
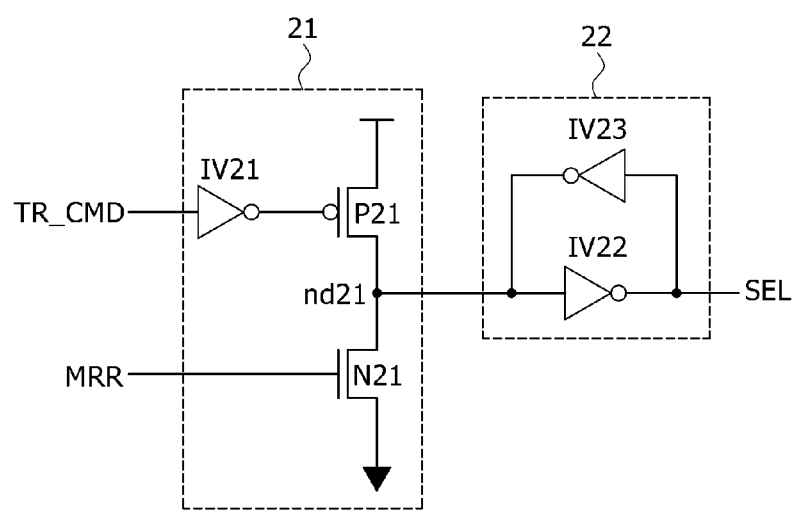
FIG. 2 is a circuit diagram illustrating a representation of an example of a select signal generation circuit included in the semiconductor device shown in FIG. 1.

Referring to FIG. 2, the select signal generation circuit 2 may include an input driver 21 and an output latch 22.

The input driver 21 may include an inverter IV21, a PMOS transistor P21, and an NMOS transistor N21. The input driver 21 may drive a node nd21 in response to the training command TR_CMD and the mode register read command MRR. The input driver 21 may pull-up drive the node nd21 to a logic high level in the case where the training command TR_CMD is generated to a logic high level as the training operation is performed. The input driver 21 may pull-down drive the node nd21 to a logic low level in the case where the mode register read command MRR is generated to the logic high level as the mode register read operation is performed.

The output latch 22 may include inverters IV22 and IV23. The output latch 22 may invert and buffer the signal of the node nd21, and output the select signal SEL. The output latch 22 may latch the signal of the node nd21 and the select signal SEL.

The select signal generation circuit 2 may drive the select signal SEL to a logic high level in the case where the training command TR_CMD is generated, and drive the select signal SEL to a logic low level in the case where the mode register read command MRR is generated.

Figure 3:
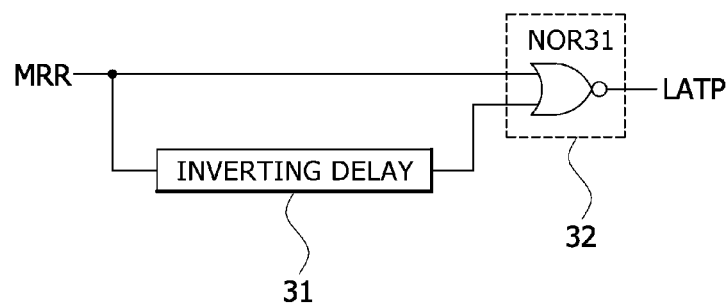
FIG. 3 is a circuit diagram illustrating a representation of an example of a latch pulse generation circuit included in the semiconductor device shown in FIG. 1.

Referring to FIG. 3, the latch pulse generation circuit 3 may include an inverting delay 31 and a pulse output 32.

The inverting delay 31 may be embodied by an inverter chain (not shown) which includes an odd number of inverters. The inverting delay 31 may invert and buffer the mode register read command MRR, and output an output signal.

The pulse output 32 may generate the latch pulse LATP in response to the mode register read command MRR and the output signal of the inverting delay 31. The pulse output 32 may be inputted with the mode register read command MRR and the output signal of the inverting delay 31, and perform a NOR logic function.

The latch pulse generation circuit 3 may generate the latch pulse LATP in synchronization with a time that the mode register read command MRR transitions from the logic high level to the logic low level, that is, a falling edge.

Figure 4:
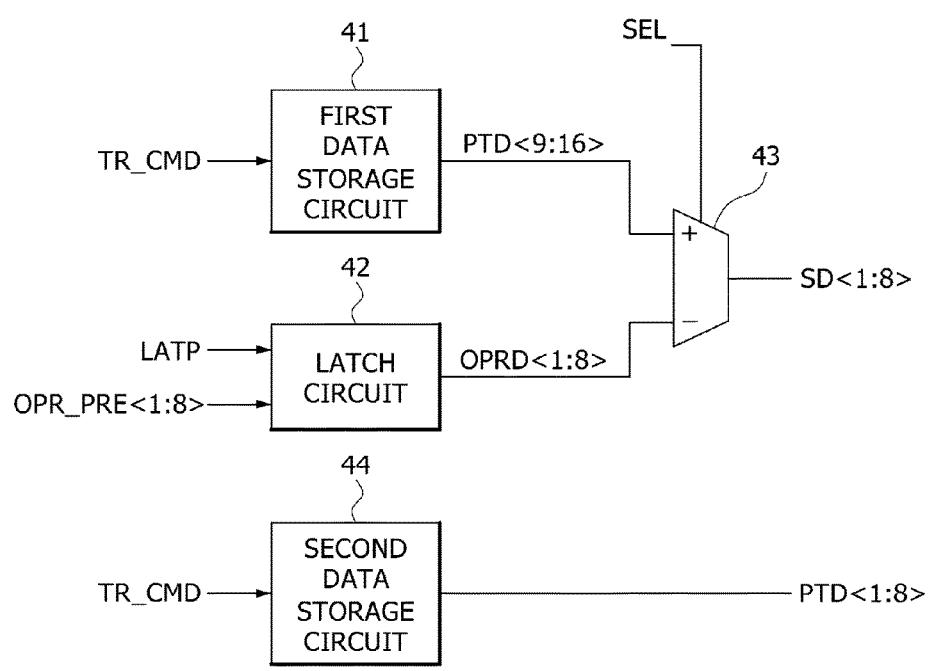
FIG. 4 is a block diagram illustrating a representation of an example of a configuration of a data output selection circuit included in the semiconductor device shown in FIG. 1.

Referring to FIG. 4, the data output selection circuit 4 may include a first data storage circuit 41, a latch circuit 42, a data selector 43, and a second data storage circuit 44.

The first data storage circuit 41 may be embodied by mode registers (not shown) which store the ninth to sixteenth pattern data PTD<9:16> according to a mode register set operation or a mode register write operation. In particular, the first data storage circuit 41 may store and then output the ninth to sixteenth pattern data PTD<9:16> if the training operation is performed. According to an embodiment, the ninth to sixteenth pattern data PTD<9:16> may be generated inside the semiconductor device or be applied from an exterior of the semiconductor device upon receiving the training command TR_CMD.

The latch circuit 42 may generate first to eighth information data OPRD<1:8> from the first to eighth pre-information data OPR_PRE<1:8> in response to the latch pulse LATP. The latch circuit 42 may latch the first to eighth pre-information data OPR_PRE<1:8> in the case where the latch pulse LATP is generated, and then output the first to eighth information data OPRD<1:8>. The pre-information data OPR_PRE<1:8> may be stored in mode registers (not shown) according to the mode register set operation or the mode register write operation. Further, the latch circuit 42 may output the first to eighth information data OPRD<1:8> by latching the first to eighth pre-information data OPR_PRE<1:8> if the mode register read operation is performed. According to an embodiment, the first to eighth pre-information data OPR_PRE<1:8> may be generated inside the semiconductor device or be applied from an exterior of the semiconductor device.

The data selector 43 may output the ninth to sixteenth pattern data PTD<9:16> or the first to eighth information data OPRD<1:8> as the selection data SD<1:8> in response to the select signal SEL. The data selector 43 may output the ninth to sixteenth pattern data PTD<9:16> as the selection data SD<1:8> in the case where the select signal SEL is the logic high level as the training operation is performed. The data selector 43 may output the first to eighth information data OPRD<1:8> as the selection data SD<1:8> in the case where the select signal SEL is the logic low level as the mode register read operation is performed.

The second data storage circuit 44 may be embodied by mode registers (not shown) which store the first to eighth pattern data PTD<1:8> according to the mode register set operation or the mode register write operation. According to an embodiment, the first to eighth pattern data PTD<1:8> may be generated inside the semiconductor device or be applied from an exterior of the semiconductor device upon receiving the training command TR_CMD.

In the case where the training operation is performed, the second data storage circuit 44 of the data output selection circuit 4 may output the first to eighth pattern data PTD<1:8>, and the data output selection circuit 4 may output the ninth to sixteenth pattern data PTD<9:16> as the first to eighth selection data SD<1:8>. In the case where the mode register read operation is performed, the data output selection circuit 4 may output the pre-information data OPR_PRE<1:8> as the first to eighth selection data SD<1:8>.

Referring to FIG. 5, bit sequences of data outputted in a training operation are illustrated.

In the case where a training operation is performed, the ninth to sixteenth pattern data PTD<9:16> are outputted as the first to eighth selection data SD<1:8> through the first to eighth data pads 5(1:8).

The bit sequence of the first selection data SD<1> may be set to '1010011011100011.' The fact that the bit sequence of the first selection data SD<1> is set to '1010011011100011' means that data set to a logic high level are outputted in first and second turns, data set to a logic low level are outputted in third to fifth turns, data set to the logic high level are outputted in sixth to eighth turns, data set to the logic low level is outputted in a ninth turn, data set to the logic high level are outputted in tenth and eleventh turns, data set to the logic low level are outputted in twelfth and thirteenth turns, data set to the logic high level is outputted in a fourteenth turn, data set to the logic low level is outputted in a fifteenth turn, and data set to the logic high level is outputted in a sixteenth turn. Because more logic high levels are included in the bit sequence of the first selection data SD<1>, the first selection data SD<1> may be outputted through the first data pad 5(1) by being inverted.

The bit sequence of the second selection data SD<2> may be set to '0101100100011100.' Because more logic low levels are included in the bit sequence of the second selection data SD<2>, the second selection data SD<2> may be outputted through the second data pad 5(2) without inverting the bit sequence. The bit sequence of the third selection data SD<3> may be set to '1010011011100011.' Because more logic high levels are included in the bit sequence of the third selection data SD<3>, the third selection data SD<3> may be outputted through the third data pad 5(3) by being inverted. The bit sequence of the fourth selection data SD<4> may be set to '0101100100011100.' Because more logic low levels are included in the bit sequence of the fourth selection data SD<4>, the fourth selection data SD<4> may be outputted through the fourth data pad 5(4) without inverting the bit sequence. The bit sequence of the fifth selection data SD<5> may be set to '1010011011100011.' Because more logic high levels are included in the bit sequence of the fifth selection data SD<5>, the fifth selection data SD<5> may be outputted through the fifth data pad 5(5) by being inverted. The bit sequence of the sixth selection data SD<6> may be set to '0101100100011100.' Because more logic low levels are included in the bit sequence of the sixth selection data SD<6>, the sixth selection data SD<6> may be outputted through the sixth data pad 5(6) without inverting the bit sequence. The bit sequence of the seventh selection data SD<7> may be set to '1010011011100011.' Because more logic high levels are included in the bit sequence of the seventh selection data SD<7>, the seventh selection data SD<7> may be outputted through the seventh data pad 5(7) by being inverted. The bit sequence of the eighth selection data SD<8> may be set to '0101100100011100.' Because more logic low levels are included in the bit sequence of the eighth selection data SD<8>, the eighth selection data SD<8> may be outputted through the eighth data pad 5(8) without inverting the bit sequence.

The bit sequence of the first pattern data PTD<1> may be set to '1010011011100011.' Because more logic high levels are included in the bit sequence of the first pattern data PTD<1>, the first pattern data PTD<1> may be outputted through the ninth data pad 5(9) by being inverted. The bit sequence of the second pattern data PTD<2> may be set to '0101100100011100.' Because more logic low levels are included in the bit sequence of the second pattern data PTD<2>, the second pattern data PTD<2> may be outputted through the tenth data pad 5(10) without inverting the bit sequence. The bit sequence of the third pattern data PTD<3> may be set to '1010011011100011.' Because more logic high levels are included in the bit sequence of the third pattern data PTD<3>, the third pattern data PTD<3> may be outputted through the eleventh data pad 5(11) by being inverted. The bit sequence of the fourth pattern data PTD<4> may be set to '0101100100011100.' Because more logic low levels are included in the bit sequence of the fourth pattern data PTD<4>, the fourth pattern data PTD<4> may be outputted through the twelfth data pad 5(12) without inverting the bit sequence. The bit sequence of the fifth pattern data PTD<5> may be set to '1010011011100011.' Because more logic high levels are included in the bit sequence of the fifth pattern data PTD<5>, the fifth pattern data PTD<5> may be outputted through the thirteenth data pad 5(13) by being inverted. The bit sequence of the sixth pattern data PTD<6> may be set to '0101100100011100.' Because more logic low levels are included in the bit sequence of the sixth pattern data PTD<6>, the sixth pattern data PTD<6> may be outputted through the fourteenth data pad 5(14) without inverting the bit sequence. The bit sequence of the seventh pattern data PTD<7> may be set to '1010011011100011.' Because more logic high levels are included in the bit sequence of the seventh pattern data PTD<7>, the seventh pattern data PTD<7> may be outputted through the fifteenth data pad 5(15) by being inverted. The bit sequence of the eighth pattern data PTD<8> may be set to '0101100100011100.' Because more logic low levels are included in the bit sequence of the eighth pattern data PTD<8>, the eighth pattern data PTD<8> may be outputted through the sixteenth data pad 5(16) without inverting the bit sequence.

Figure 6:
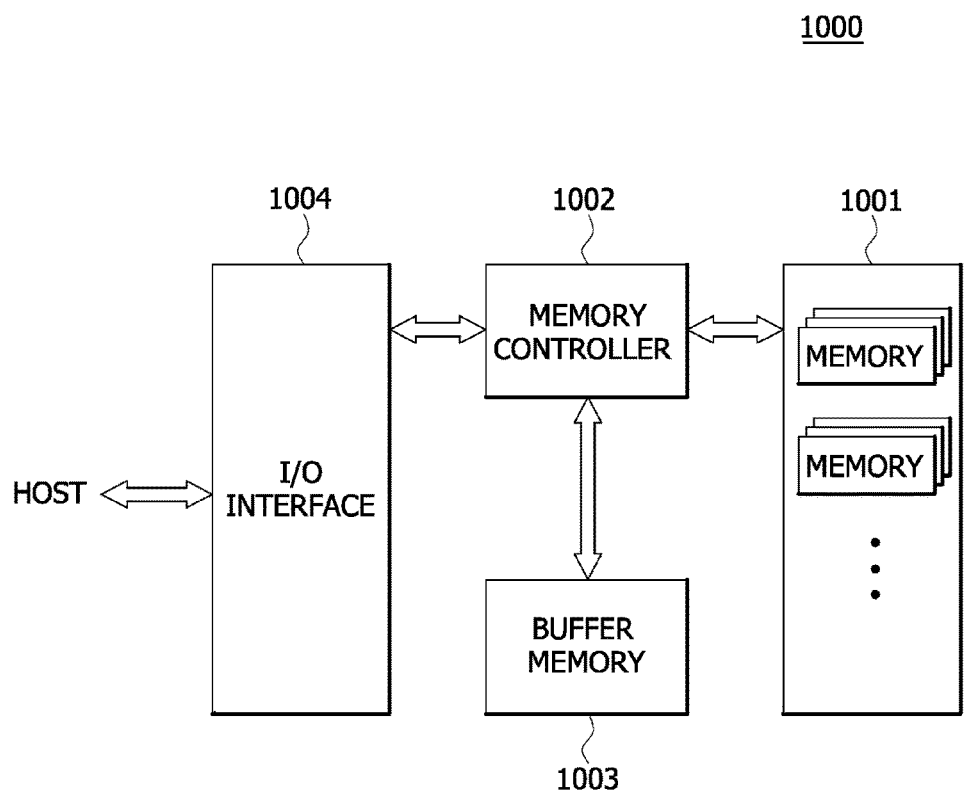
FIG. 6 is a diagram illustrating a representation of an example of a configuration of an electronic system to which the semiconductor device illustrated in FIGS. 1 to 5 is applied.

The semiconductor device described above with reference to FIG. 1 may be applied to an electronic system which includes a memory system, a graphic system, a computing system or a mobile system. For example, referring to FIG. 6, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor device shown in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM), or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 6, a controller for controlling the data storage 1001 and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM, or an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood by those skilled in the art that the embodiments described are by way of example only. Accordingly, the semiconductor device described herein should not be limited based on the described embodiments.

What is claimed is:

1. A semiconductor device comprising:
    a data output selection circuit suitable for outputting first pattern data as selection data in the case where a training operation is performed, outputting information data as the selection data in the case where a mode register read operation is performed, and outputting second pattern data in the case where the training operation is performed;
    a data pad circuit including a first data pad and a second data pad; and
    a command decoder suitable for decoding a command address, and generating a training command which is generated for performing the training operation and the mode register read command which is generated for performing the mode register read operation,
    wherein the first data pad outputs the selection data and the second data pad outputs the second pattern data.

2. The semiconductor device according to claim 1, wherein the data output selection circuit comprises:
    a data selector suitable for outputting the first pattern data as the selection data in the case where the training operation is performed, and outputting the information data as the selection data in the case where the mode register read operation is performed; and
    a first data storage circuit suitable for outputting the second pattern data in the case where the training operation is performed.

3. The semiconductor device according to claim 2, wherein the data output selection circuit further comprises:
    a second data storage circuit suitable for storing the first pattern data, the second data storage circuit outputting the first pattern data in the case where the training operation is performed.

4. The semiconductor device according to claim 2, wherein the data output selection circuit further comprises:
    a latch circuit suitable for outputting the information data by latching pre-information data in the case where the mode register read operation is performed.

5. The semiconductor device according to claim 4, wherein the latch circuit outputs the information data in response to receiving a latch pulse.

6. The semiconductor device according to claim 1, further comprising:
    a select signal generation circuit suitable for generating a select signal, the select signal having a first logic level in the case where the training operation is performed and having a second logic level in the case where the mode register read operation is performed.

7. The semiconductor device according to claim 6, wherein the select signal generation circuit further comprises:
    an input driver suitable for driving a node to the first logic level if a training command is generated having the first logic level as the training operation is performed, and for driving the node to the second logic level if the mode register read command is generated to the first logic level as the mode register read operation is performed.

8. The semiconductor device according to claim 1, further comprising:
    a latch pulse generation circuit suitable for generating a latch pulse, the latch pulse being generated in synchronization with a mode register read command.

9. The semiconductor device according to claim 8, wherein the latch pulse is generated in synchronization with a falling edge of the mode register read command.

10. The semiconductor device according to claim 1, further comprising inverting the output of the first data pad and the output of the second data pad based on a bit sequence stored in the first data pad and the second data pad.

11. A semiconductor device comprising:
    a data selector suitable for outputting first pattern data as selection data in the case where a training operation is performed, and outputting information data as the selection data in the case where a mode register read operation is performed;
    a first data storage circuit suitable for outputting second pattern data in the case where the training operation is performed;
    a command decoder suitable for decoding a command address, and generating a training command which is generated for performing the training operation and the mode register read command which is generated for performing the mode register read operation.

12. The semiconductor device according to claim 11, further comprising:

a second data storage circuit suitable for storing the first pattern data, the second data storage circuit outputting the first pattern data in the case where the training operation is performed.

13. The semiconductor device according to claim 11, further comprising:
   a latch circuit suitable for outputting the information data by latching pre-information data in the case where the mode register read operation is performed.

14. The semiconductor device according to claim 13, wherein the latch circuit outputs the information data in response to receiving a latch pulse.

15. The semiconductor device according to claim 11, further comprising:
   a select signal generation circuit suitable for generating a select signal, the select signal having a first logic level in the case where the training operation is performed and having a second logic level in the case where the mode register read operation is performed.

16. The semiconductor device according to claim 11, further comprising:
   a latch pulse generation circuit suitable for generating a latch pulse, the latch pulse being generated in synchronization with a mode register read command.

17. The semiconductor device according to claim 16, wherein the latch pulse is generated in synchronization with a falling edge of the mode register read command.

18. The semiconductor device according to claim 11 further comprising:
   a data pad circuit including data pads through which the first pattern data is output during the training operation and through which the second pattern data is output during the mode register read operation.

* * * * *